United States Patent
Lee et al.

(10) Patent No.: US 12,262,454 B2
(45) Date of Patent: Mar. 25, 2025

(54) NITRIDE-BASED MULTI-WAVELENGTH LIGHT EMITTING DIODE SYSTEM AND CONTROL METHOD THEREOF

(71) Applicant: TECH UNIVERSITY OF KOREA Industry Academic Cooperation Foundation, Gyeonggi-do (KR)

(72) Inventors: Sung-Nam Lee, Incheon (KR); Gun Woo Lee, Seoul (KR)

(73) Assignee: TECH UNIVERSITY OF KOREA Industry Academic Cooperation Foundation, Gyeonggi-do (KR)

( * ) Notice: Subject to any disclaimer, the term of this patent is extended or adjusted under 35 U.S.C. 154(b) by 185 days.

(21) Appl. No.: 17/890,473

(22) Filed: Aug. 18, 2022

(65) Prior Publication Data

US 2023/0209676 A1    Jun. 29, 2023

(30) Foreign Application Priority Data

Dec. 28, 2021    (KR) .................. 10-2021-0190381

(51) Int. Cl.
*H05B 45/10*    (2020.01)
*H05B 45/20*    (2020.01)
(Continued)

(52) U.S. Cl.
CPC .......... *H05B 45/325* (2020.01); *H05B 45/20* (2020.01); *H10H 20/812* (2025.01); *H10H 20/825* (2025.01)

(58) Field of Classification Search
CPC ........ H05B 45/10; H05B 45/20; H05B 45/30; H05B 45/325; H05B 47/10; H01L 33/06; H01L 33/32
See application file for complete search history.

(56) References Cited

U.S. PATENT DOCUMENTS

| | | | | |
|---|---|---|---|---|
| 2008/0247435 A1* | 10/2008 | Choi | ............... | B82Y 20/00 |
| | | | | 372/46.01 |
| 2011/0101881 A1* | 5/2011 | Kamikawa | ............... | G09G 3/14 |
| | | | | 315/250 |
| 2021/0091268 A1 | 3/2021 | Dierolf et al. | | |

FOREIGN PATENT DOCUMENTS

| JP | H 5-198844 A | 1/1992 |
|---|---|---|
| JP | 2008263249 A | 10/2008 |

(Continued)

OTHER PUBLICATIONS

Office Action dated Jun. 27, 2023 of the corresponding Japanese Patent Application No. 2022-130634, 5 pp.

(Continued)

*Primary Examiner* — Jimmy T Vu
(74) *Attorney, Agent, or Firm* — Taft, Stettinius & Hollister LLP

(57) ABSTRACT

According to one exemplary embodiment of the present disclosure, a light emitting diode system includes: a nitride-based multi-wavelength light emitting diode including a first semiconductor layer doped with an n-type material, a second semiconductor layer doped with a p-type material, and an active layer disposed between the first semiconductor layer and the second semiconductor layer and having a structure of an indium gallium nitride (InGaN)-based quantum well; and a control unit configured to adjust and apply at least one of a pulse width and a duty cycle of an injection current to the nitride-based multi-wavelength light emitting diode.

6 Claims, 7 Drawing Sheets

(51) Int. Cl.
    *H05B 45/325*      (2020.01)
    *H05B 47/10*      (2020.01)
    *H10H 20/812*      (2025.01)
    *H10H 20/825*      (2025.01)

(56) References Cited

FOREIGN PATENT DOCUMENTS

| | | | |
|---|---|---|---|
| JP | 2013175679 A | 9/2013 | |
| KR | 20210035034 | 3/2021 | |

OTHER PUBLICATIONS

Lee, Gun Woo, et al., "A study on monolithic red, green and blue semi-polarized nitride-based light emitting diodes", Korea Polytechnic University, Proceedings of Regular Academic Conference, The 61st Summer Acadmic Conference of the Korean Vacuum Society 217, Aug. 18, 2021 (26 pgs).

Office Action dated Nov. 20, 2023 of the corresponding Korean Patent Application No. 10-2021-0190381, 5 pp.

Office Acton dated Nov. 11, 2024, of the corresponding Korean Patent Application No. 10-2021-0190381, 5pgs.

* cited by examiner

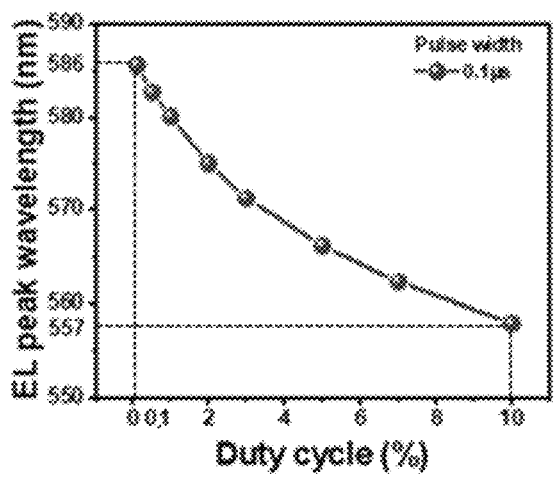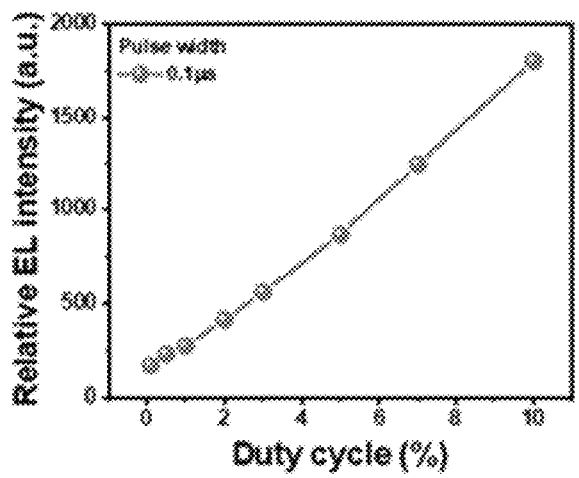
FIG. 4
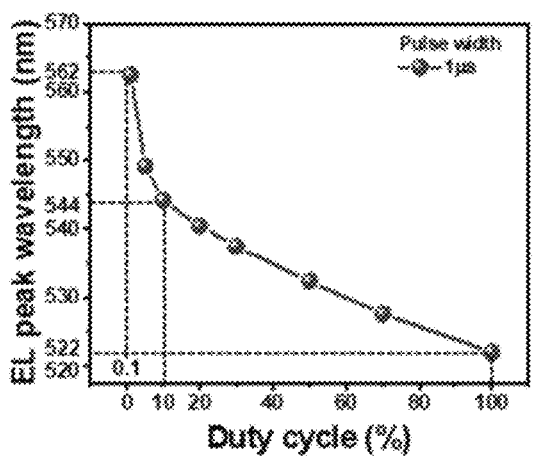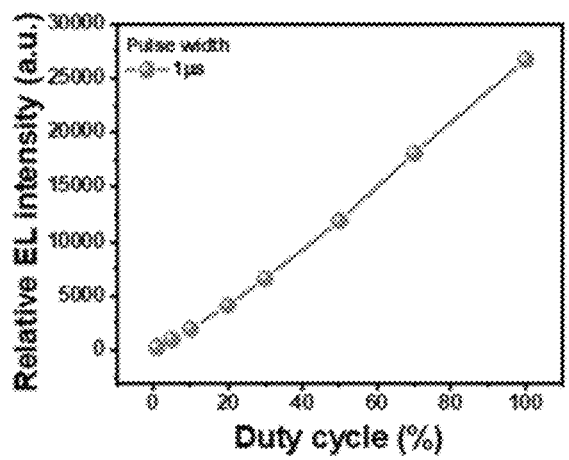
FIG. 5

NITRIDE-BASED MULTI-WAVELENGTH LIGHT EMITTING DIODE SYSTEM AND CONTROL METHOD THEREOF

CROSS-REFERENCE TO RELATED APPLICATION

This application claims priority to and the benefit of Korean Patent Application No. 10-2021-0190381, filed on Dec. 28, 2021, the disclosure of which is incorporated herein by reference in its entirety.

BACKGROUND

1. Field of the Invention

The present disclosure relates to a nitride-based multi-wavelength light emitting diode system and a control method thereof.

2. Discussion of Related Art

Nitride-based semiconductors have a band gap corresponding to an area from an ultraviolet region to an infrared region including visible light and are mainly used in a full color display system in a light emitting diode. In this case, in order to cover a visible ray region for full color implementation, the light emitting diode may be composed of various materials emitting light of each color. For example, aluminum gallium indium phosphide (AlGaInP) for red, aluminum gallium arsenide (AlGaAs) for green, and indium gallium nitride (InGaN) for blue are used as representative nitride-based light emitting diode materials. Among the materials, InGaN can cover a visible ray region from infrared (0.7 eV) to ultraviolet (3.4 eV) depending on the composition of indium (In), so that it is suitable for implementing a full color display.

Accordingly, it has recently been reported that an InGaN active layer-based light emitting diode emits a wide range of visible light from one device using agglomeration according to a composition ratio of indium and a blue shift phenomenon according to piezoelectric characteristics. In particular, the InGaN active layer-based light emitting diode can be applied to a full color display because the wavelength is shortened due to a band filling phenomenon and thus a light emitting wavelength can be adjusted by an applied bias as the intensity of injection current increases.

Specifically, in the InGaN active layer-based light emitting diode, as the composition of indium increases, a compositional fluctuation of a band gap occurs due to agglomeration. Accordingly, when a current is injected, long-wavelength light emission is preferentially started while carriers fill a locally formed low-energy band gap, and as the intensity of the injection current increases, a high-energy band gap is filled, resulting in shorter wavelength. In addition, even in a polarized nitride-based semiconductor with the piezoelectric phenomenon, due to a small number of carriers under a low current density, light emission occurs at a long wavelength, which is a low band gap, due to band bending caused by the piezoelectric phenomenon, and as the band is flattened by the piezoelectric cancellation phenomenon caused by a high current injection, the high-energy band gap is filled, resulting in shorter wavelength.

In addition, in manufacturing a nitride-based light emitting diode, the blue shift phenomenon occurs due to a difference in indium composition and a difference in growth rate, and research on multi-wavelength light emitting characteristics of a nitride-based light emitting diode based thereon is being actively conducted.

SUMMARY OF THE INVENTION

The present disclosure is directed to providing a nitride-based multi-wavelength light emitting diode system which can emit light of different wavelengths even when the intensity of an injection current is constant.

Also, the present disclosure is directed to providing a nitride-based multi-wavelength light emitting diode system which can implement a full color display in one light emitting diode.

According to one exemplary embodiment of the present disclosure, a light emitting diode system includes a nitride-based multi-wavelength light emitting diode including a first semiconductor layer doped with an n-type material, a second semiconductor layer doped with a p-type material, and an active layer disposed between the first semiconductor layer and the second semiconductor layer and having a structure of an indium gallium nitride (InGaN)-based quantum well; and a control unit configured to adjust and apply at least one of a pulse width and a duty cycle of an injection current to the nitride-based multi-wavelength light emitting diode.

The control unit may control an intensity of the injection current to be maintained the same.

The control unit may adjust and apply the intensity of the injection current.

A wavelength of light emitted by the nitride-based multi-wavelength light emitting diode may decrease as the pulse width of the injection current increases.

A wavelength of light emitted by the nitride-based multi-wavelength light emitting diode may decrease as the duty cycle of the injection current increases.

The control unit may apply two or more injection currents having different pulse widths and duty cycles so that the nitride-based multi-wavelength light emitting diode emits light of two or more wavelengths.

According to one exemplary embodiment of the present disclosure, a control method of a light emitting diode system includes an operation of adjusting and applying at least one of a pulse width and a duty cycle of an injection current to a nitride-based multi-wavelength light emitting diode including a first semiconductor layer doped with an n-type material, a second semiconductor layer doped with a p-type material, and an active layer disposed between the first semiconductor layer and the second semiconductor layer and having a structure of an InGaN-based quantum well.

The applying operation may include an operation of controlling an intensity of the injection current to be maintained the same.

The applying operation may include an operation of adjusting and applying the intensity of the injection current.

The applying process may include an operation of applying two or more injection currents having different pulse widths and duty cycles so that the nitride-based multi-wavelength light emitting diode emits light of two or more wavelengths.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 4 illustrates a graph measuring a change that appears according to duty cycle adjustment of an injection current according to exemplary embodiment 1;

FIG. 5 illustrates a graph measuring a change that appears according to duty cycle adjustment of an injection current according to exemplary embodiment 2;

DETAILED DESCRIPTION OF EXEMPLARY EMBODIMENTS

Figure 1:
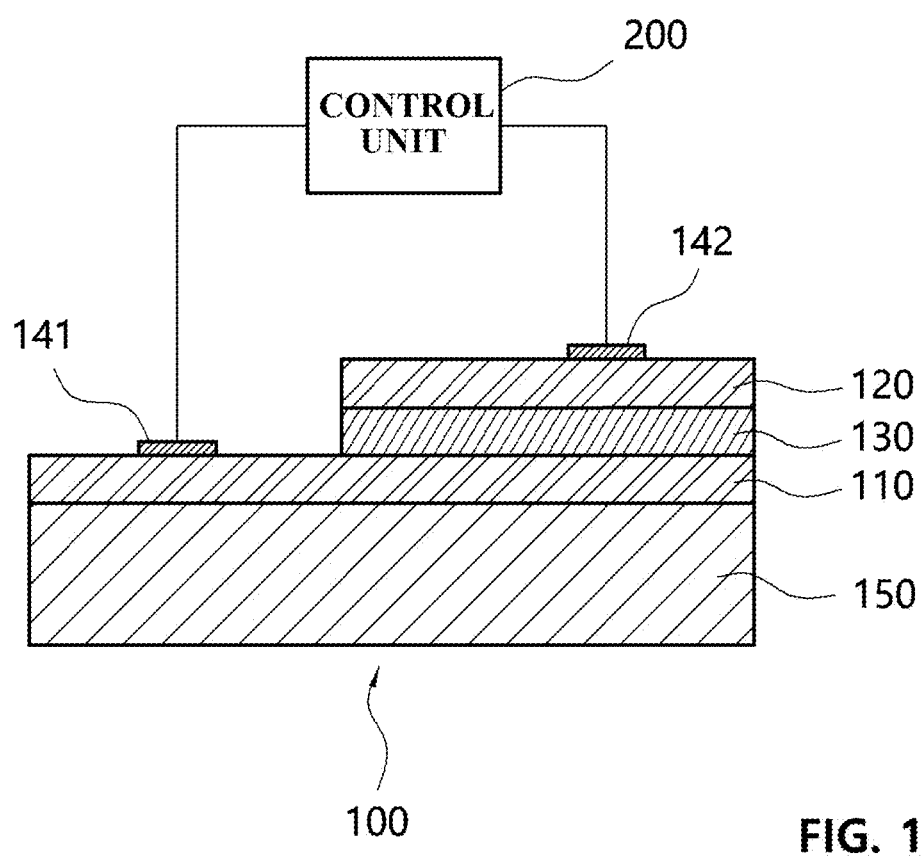
FIG. 1 is a schematic diagram illustrating a nitride-based multi-wavelength light emitting diode system according to one exemplary embodiment of the present disclosure.

Hereinafter, exemplary embodiments according to the present disclosure will be described in detail with reference to the accompanying drawings. The detailed description set forth below in conjunction with the accompanying drawings is intended to describe exemplary embodiments of the present disclosure and is not intended to represent the only embodiment in which the present disclosure may be implemented. In order to clearly describe the present disclosure in the drawings, parts irrelevant to the description may be omitted, and the same reference numerals may be used for the same or similar components throughout the specification.

FIG. 1 is a schematic diagram illustrating a nitride-based multi-wavelength light emitting diode system according to one exemplary embodiment of the present disclosure.

A nitride-based multi-wavelength light emitting diode system 1 (hereinafter referred to as a system 1) according to one exemplary embodiment of the present disclosure includes a nitride-based multi-wavelength light emitting diode 100 (hereinafter referred to as a light emitting diode 100) and a control unit 200.

According to one exemplary embodiment of the present disclosure, the light emitting diode 100 includes a first semiconductor layer 110, a second semiconductor layer 120, and an active layer 130 disposed between the first semiconductor layer 110 and the second semiconductor layer 120, and a first electrode 141 is disposed on the first semiconductor layer 110 and a second electrode 142 is disposed on the second semiconductor layer 120.

According to one exemplary embodiment of the present disclosure, each of the first semiconductor layer 110, the second semiconductor layer 120, and the active layer 130 may include a nitride semiconductor. For example, the nitride semiconductor may include at least one selected from the group consisting of gallium nitride (GaN), indium gallium nitride (InGaN), indium aluminum gallium nitride (InAlGaN), aluminum gallium nitride (AlGaN), boron aluminum gallium nitride (BAlGaN), and boron indium aluminum gallium nitride (BInAlGaN). In this case, the light emitting diode 100 may be any one of polarized, non-polarized, and semi-polarized nitride-based light emitting diodes according to a growth method and a manufacturing method thereof.

According to one exemplary embodiment of the present disclosure, when the first semiconductor layer 110 is doped with an n-type material, the second semiconductor layer 120 may be doped with a p-type material. In addition, the active layer 130 is a layer that emits light by a recombination of electron-hole and includes a single quantum well layer or multiple quantum well layers. The quantum well layer will be described in detail with reference to FIG. 2.

In addition, the first electrode 141 may be formed of an n-type conductive material, and the second electrode 142 may be formed of a p-type conductive material.

For example, the first electrode 141 and the second electrode 142 may include at least one selected from the group consisting of platinum (Pt), aluminum (Al), lead (Pb), tin (Sn), gold (Au), germanium (Ge), copper (Cu), bismuth (Bi), cadmium (Cd), zinc (Zn), silver (Ag), nickel (Ni), and titanium (Ti).

The control unit 200 according to one exemplary embodiment of the present disclosure includes a driving circuit configured to drive the light emitting diode 100 and is not limited to the configuration and structure thereof. The control unit 200 adjusts a wavelength of light emitted from the light emitting diode 100 by adjusting and applying pulse conditions and current conditions of an injection current to the light emitting diode 100.

According to one exemplary embodiment of the present disclosure, the light emitting diode 100 is grown on a wafer 150. In this case, the wafer 150 may be an insulating substrate or a conductive substrate. The wafer 150 may include, for example, at least one selected from the group consisting of a sapphire substrate, a glass substrate, a silicon carbide substrate, a silicon substrate, a metal substrate, and a ceramic substrate.

According to one exemplary embodiment of the present disclosure, the light emitting diode 100 is shown as a flat structure including a mesa structure, but is not limited thereto, and by using a conductive substrate such as n-GaN or n-Si as the wafer 150, the light emitting diode 100 may be implemented as a flat structure that does not include a mesa structure in which the first electrode 141 is disposed under the wafer 150, or a flat structure that does not include a mesa structure in which both the first electrode 141 and the second electrode 142 are disposed on the second semiconductor layer 120 by implementing the first electrode 141 as a p* electrode in which a breakdown conductive channel is formed.

In addition, although not shown in FIG. 1, the light emitting diode 100 according to one exemplary embodiment of the present disclosure may be transferred to a separate wafer and implemented as a display.

Figure 2:
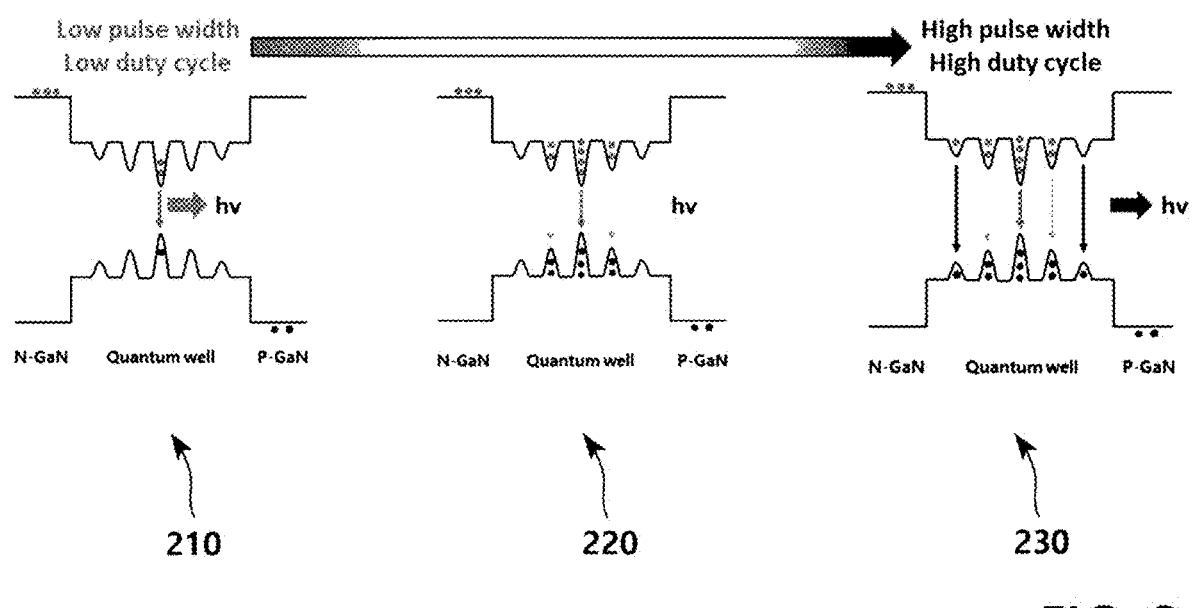
FIG. 2 is a view illustrating a change in a wavelength according to a pulse condition of an injection current according to one exemplary embodiment of the present disclosure.

FIG. 2 is a view illustrating a change in a wavelength according to a pulse condition of an injection current according to one exemplary embodiment of the present disclosure.

As described above, the light emitting diode 100 may be a polarized, non-polarized, and semi-polarized nitride-based light emitting diodes according to a growth method and a manufacturing method thereof. Among them, a half-polarized (11-22)-plane GaN thin film has higher indium implantation efficiency than a non-polarized (10-10) GaN thin film, which is advantageous for longer wavelength and improvement of luminous efficiency.

When the half-polarized (11-22)-plane GaN thin film is grown on an m-sapphire which is a heterogeneous substrate, high defects occur, and an epitaxial lateral overgrowth (ELO) process is used to reduce the defects.

Among them, when a hexagonal pattern ELO is used, several shapes may appear due to different side growth rates in each of six directions in the hexagonal pattern, and due to this difference in growth rates, an arrowhead-shaped structure appears.

Since the light emitting diode 100 according to one exemplary embodiment of the present disclosure has the arrowhead-shaped structure, there may be a difference in indium composition for each position according to a crystal growth plane of the arrowhead structure. For example, a (20-21) plane, which is a vertex of the arrowhead shape, has the highest indium composition ratio, and the indium composition ratio may decrease in the order of a (10-11) plane, which is a side surface, and the (11-22) plane, which is the top plane. As the indium composition varies for each crystal plane, a strong blue shift phenomenon occurs.

As shown in FIG. 2, the active layer 130 according to one exemplary embodiment of the present disclosure includes a thick quantum well layer structure in which a blue shift phenomenon may be greatly formed. For example, the active layer 130 may include a quantum well layer of 2.5 nm or more.

In the light emitting diode 100 according to one exemplary embodiment of the present disclosure, indium content may be increased to increase indium localization and increase red light emission efficiency. For example, the indium content in the total composition ratio may be 20% or more. In addition, it may have a structure including a crystal plane and V-type defects which can increase an indium mole fraction.

According to one exemplary embodiment of the present disclosure, as shown in FIG. 2, in the light emitting diode 100, as the composition of indium increases, the compositional fluctuation of the band gap occurs due to agglomeration. As the carrier fills a locally formed low energy band gap toward the left side 210, the middle side 220, and the right side 230 of FIG. 2, light emission of long wavelength starts preferentially, and as the number of injected carriers increases, the wavelength is shortened as the band gap of high energy is filled.

According to one exemplary embodiment of the present disclosure, in the light emitting diode 100 having a quantum well layer structure, a method of adjusting a wavelength while controlling the number of injected carriers based on a pulse condition of an injection current is proposed. In this case, the pulse condition includes a pulse width and a duty cycle. According to one exemplary embodiment of the present disclosure, as a pulse width increases and a duty cycle increases, the number of carriers increases and a wavelength can be shortened.

Figure 3:
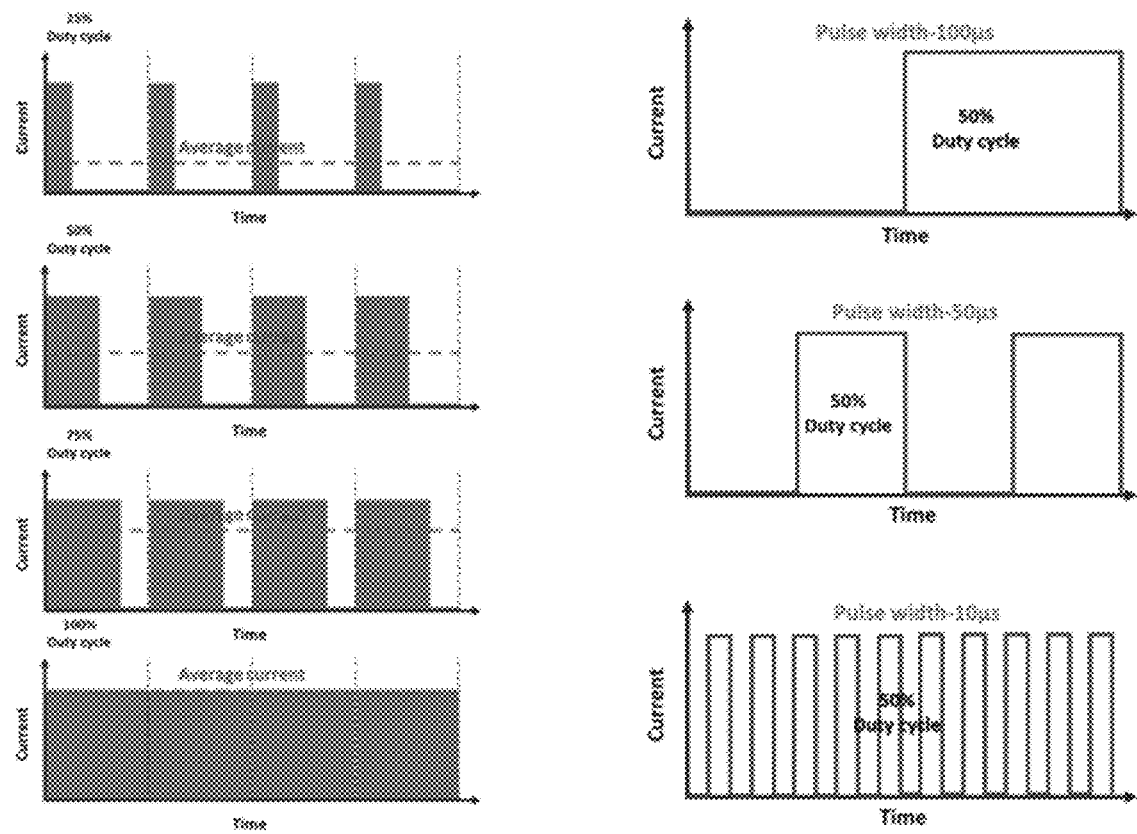
FIG. 3 is a graph illustrating a behavioral mechanism of a carrier according to one exemplary embodiment of the present disclosure.

FIG. 3 is a graph illustrating a behavioral mechanism of a carrier according to one exemplary embodiment of the present disclosure.

More specifically, the behavioral mechanism of a carrier is shown in FIG. 3 when an injection current having different pulse conditions is applied at a constant current in order to control the number of carriers injected into the light emitting diode.

Referring to FIG. 3, an increase in a duty cycle under the same pulse width condition within the same time means an increase in the number of average injected carriers. In addition, an increase in a pulse width under the same duty cycle condition within the same time means a decrease in a speed of the injected carriers. Therefore, when a pulse width and a duty cycle are increased under the same injection current, the wavelength is shortened due to a band filling phenomenon. As such, it is possible to achieve a wavelength change in a light emitting diode without changing the amount of current by changing a pulse condition when an injection current is applied.

In the present disclosure, when the same current is applied to a nitride-based light emitting diode based on the InGaN active layer in the manner shown in FIG. 3, a method of controlling an emission wavelength by adjusting a pulse width and a duty cycle of the applied injection current has been developed.

Hereinafter, the present disclosure will be described in detail with reference to the following exemplary embodiments and comparative examples. However, the technical spirit of the present disclosure is not restricted or limited thereto. In addition, the subject of applying the current will be performed by the control unit 200 as described above.

Exemplary Embodiment 1

In exemplary embodiment 1, an emission of light of different wavelengths according to an adjustment of a duty cycle of an injection current was tested.

In exemplary embodiment 1, in the light emitting diode 100 according to one exemplary embodiment of the present disclosure, the intensity of an injection current is 1 mA, the pulse width is fixed to 0.1 µs, and the duty cycle is adjusted from 0.1% to 10% and applied.

FIG. 4 illustrates a graph 410 measuring a change in an electroluminescent (EL) peak wavelength according to the duty cycle adjustment of an injection current according to exemplary embodiment 1, and a graph 420 measuring a change in a relative EL intensity.

Referring to the graph 410 of FIG. 4, it can be seen that as the duty cycle increases, the EL peak wavelength shortens by about 30 nm from 586 nm to 557 nm, and referring to the graph 420, it can be seen that the light emission intensity increases as the duty cycle increases.

As described above, it can be seen that an increase in a duty cycle under the same time causes an increase in the number of average injected carriers, so that a wavelength of emitted light is changed to a shorter side. A color of emitted light changes according to a change in a wavelength. For example, blue light appears as a wavelength is shorter, and red light appears as a wavelength is longer.

Exemplary Embodiment 2

In exemplary embodiment 2, a case in which the intensity of an injection current in a light emitting diode according to one embodiment of the present disclosure is 1 mA, the pulse width is changed from 0.1 µs to 1 µs, and the duty cycle is increased from 1% to 100% will be described.

FIG. 5 illustrates a graph 510 measuring a change in an EL peak wavelength appearing according to the duty cycle adjustment of an injection current according to exemplary embodiment 2, and a graph 520 measuring a change in relative EL intensity.

Referring to the graph 510 of FIG. 5, it can be seen that the EL peak wavelength is shortened by about 30 nm from 562 nm to 522 nm as the duty cycle increases, and referring to the graph 520, it can be seen that the emission intensity increases.

In this case, when comparing exemplary embodiment 1 and exemplary embodiment 2, the pulse width of the injection current used in exemplary embodiment 2 is 1 μs, which is higher than that of exemplary embodiment 1.

Increasing the pulse width from 0.1 μs to 1 μs indicates an increase in the number of injected carriers. Therefore, when the pulse width is 1 μs rather than 0.1 μs, the accumulated number of the injected carriers increases, and a wavelength is shortened in a shorter wavelength region.

This can also be confirmed by the fact that the wavelength of exemplary embodiment 1 was changed from 586 nm to 557 nm and the wavelength of exemplary embodiment 2 was changed from 562 nm to 544 nm, compared to the case in which the duty cycle in exemplary embodiment 2 increases to 10% in the same manner as in exemplary embodiment 1.

Through each of exemplary embodiments 1 and 2, it can be confirmed that a wavelength change may be caused by adjusting the number of carriers injected into a light-emitting diode through the duty cycle control of the injection current. In addition, by comparing exemplary embodiments 1 and 2, it can be confirmed that a wavelength change may be generated through the control of the pulse width of the injection current.

Exemplary Embodiment 3

In exemplary embodiment 3, whether the wavelength of light emitted from a light emitting diode can be changed by adjusting a pulse width as well as a duty cycle of an injection current was tested.

In exemplary embodiment 3, in a light emitting diode according to one exemplary embodiment of the present disclosure, a case in which the intensity of an injection current is 1 mA, the duty cycle is fixed to 1%, and the pulse width is adjusted from 0.1 μs to 100 μs and applied, and a case in which the intensity of an injection current is 1 mA, the duty cycle is fixed to 5%, and the pulse width is adjusted from 0.1 μs to 300 μs and applied will be described.

Figure 6:
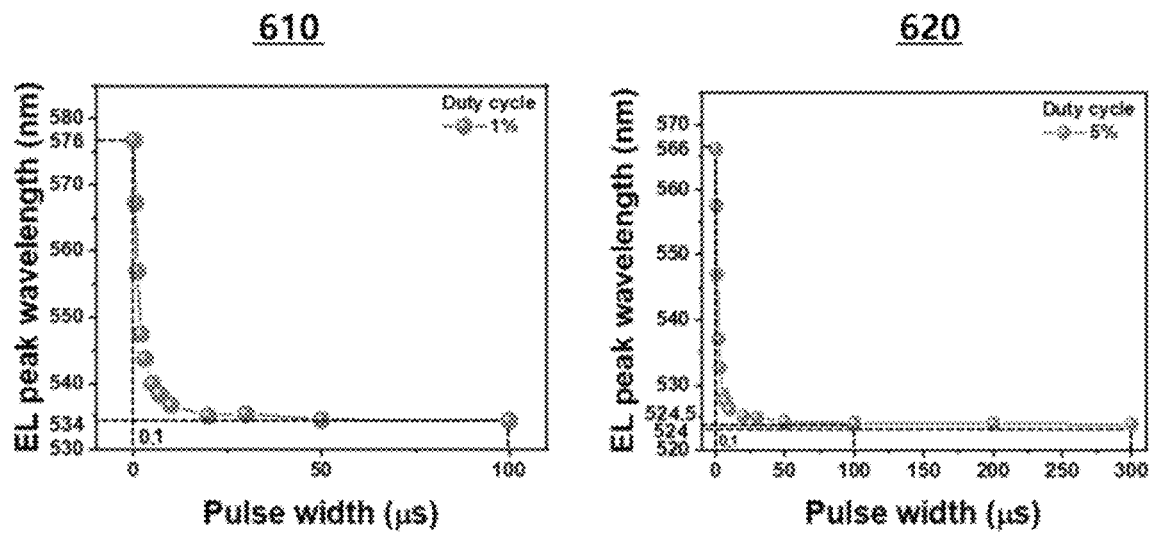
FIG. 6 illustrates a graph measuring a change that appears according to pulse width adjustment of an injection current according to exemplary embodiment 3.

FIG. 6 illustrates a graph 610 measuring a change in an EL peak wavelength that appears according to the pulse width adjustment of an injection current when a duty cycle according to exemplary embodiment 3 is 1%, and a graph 620 measuring a change in an EL peak wavelength that appears according to the pulse width adjustment of an injection current when a duty cycle is 5%.

Referring to the graph 610 of FIG. 6, as the pulse width increases from 0.1 μs to 100 μs, the EL peak wavelength is shortened by about 40 nm from 576 nm to 534 nm, and referring to the graph 620, it can be seen that as the pulse width increases from 0.1 μs to 300 μs, the EL peak wavelength is shortened by about 40 nm from 566 nm to 524 nm.

According to one exemplary embodiment of the present disclosure, an increase in a pulse width at the same time and under the same duty cycle is determined as a blue shift phenomenon due to the band filling phenomenon because the number of injected carriers increases.

In addition, the graph 610 and the graph 620 show the same tendency, and merely increasing the duty cycle from 1% to 5% means an increase in the number of carriers injected within the same time as described above. Accordingly, it can be seen from the graph 620 having a high duty cycle that a wavelength is shortened in a shorter wavelength region, which indicates that a wavelength can be changed only by changing a pulse width and a duty cycle.

Exemplary Embodiment 4

In exemplary embodiment 4, as tested in exemplary embodiments 1, 2, and 3, when injection currents having different duty cycles, pulse widths, and current intensity conditions were applied to a light emitting diode, an emitted color was observed.

Figure 7:
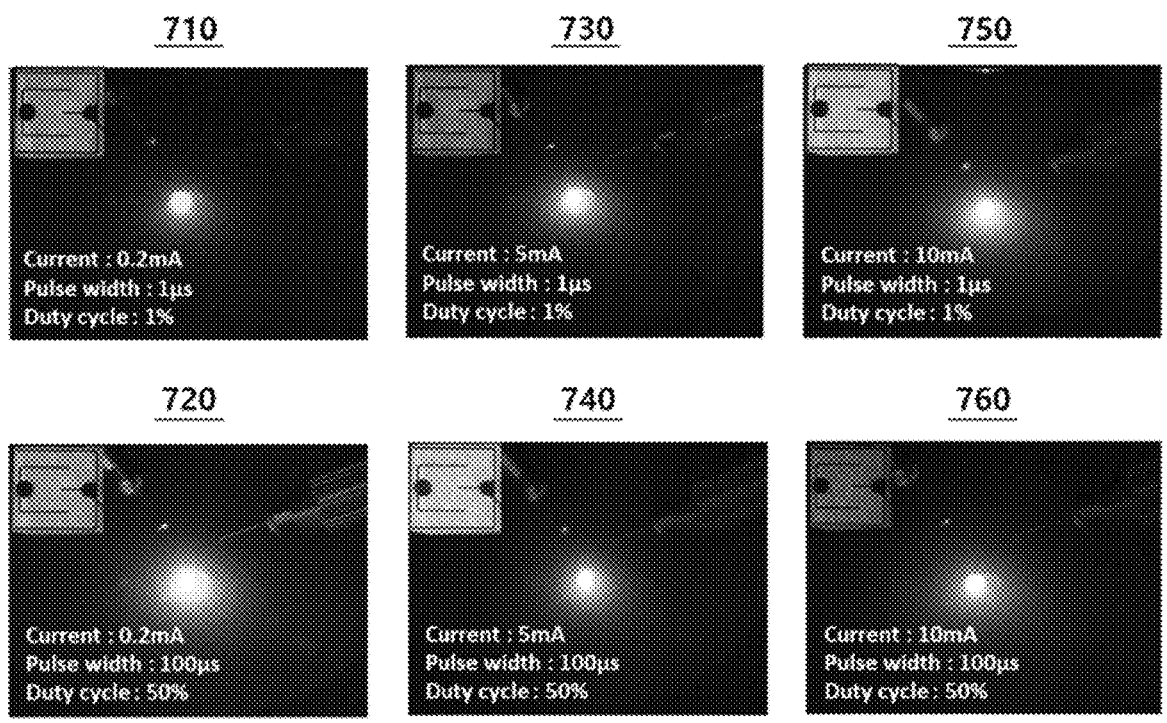
FIG. 7 is a photograph of a light emitting diode that emits light varying according to conditions of an injection current according to exemplary embodiment 4.

FIG. 7 is a photograph of a light emitting diode that emits light varying according to conditions of an injection current according to exemplary embodiment 4.

As shown in photos 710 and 720 of FIG. 7, when an injection current having a current of 0.2 mA, a pulse width of 1 μs, and a duty cycle of 1% is applied, the light emitting diode emits orange light, and when an injection current having an increased pulse width of 100 μs and an increased duty cycle of 50% at the same current of 0.2 mA is applied, the light emitting diode emits green light. This indicates that a wavelength can be controlled from orange to green in the same light emitting diode.

In addition, as shown in photos 730 and 740 of FIG. 7, when the current intensity of an injection current is increased to 5 mA, and an injection current having a pulse width of 1 μs and a duty cycle of 1% is applied, the light emitting diode emits green light, and when an injection current having an increased pulse width of 100 μs and an increased duty cycle of 50% at the same current of 5 mA is applied, it can be seen that the emission wavelength of the light emitting diode is reduced to the wavelength corresponding to blue.

In addition, as shown in photos 750 and 760 of FIG. 7, when the pulse condition is controlled while keeping the current intensity of the injection current higher, it indicates that blue-green and deep-blue can be emitted. Based on this, it is possible to control the emission wavelength only with a pulse condition, but it shows that various colors from orange to deep-blue can be implemented when controlling the amount of a current, a pulse width, and a duty cycle.

Figure 8:
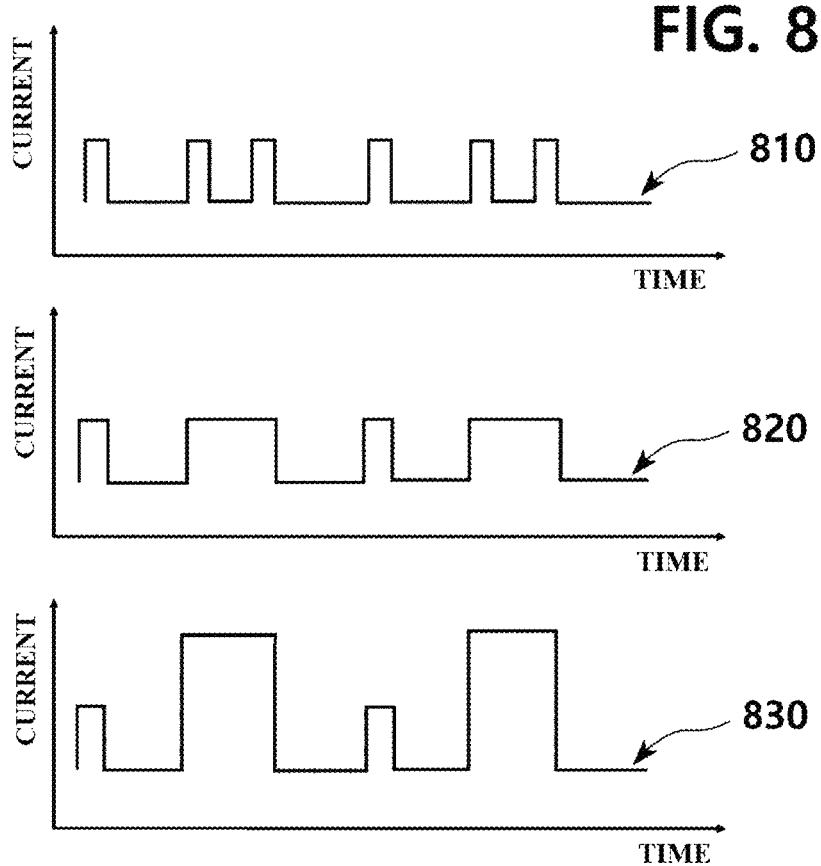
FIG. 8 is a graph illustrating injection currents generating different wavelengths.

FIG. 8 is a graph illustrating injection currents generating different wavelengths.

As shown in exemplary embodiments 1, 2, 3, and 4, different wavelengths will be generated when duty cycles, pulse widths, and currents of injection currents are each changed. Therefore, it can be seen that light of two or more wavelengths can be generated by combining injection conditions of an injection current.

A graph 810 shows waveforms of injection currents having different duty cycles. In this case, light of a short wavelength will be generated in a section of a low duty cycle, and light of a long wavelength will be generated in a section of a high duty cycle.

A graph 820 shows waveforms of injection currents having different pulse widths. In this case, alternately, light of a long wavelength will be generated in a section of a narrow pulse width, and light of a short wavelength will be generated in a section of a wide pulse width.

Finally, a graph 830 shows waveforms of injection currents having different pulse widths and different current intensities. In this case, light of a long wavelength will be generated in a section of a narrow pulse width and low current intensity, and light of a short wavelength will be generated in a section of a wide pulse width and high current intensity.

In addition, when the injection currents having different pulse widths, duty cycles, and intensities of injection currents shown in the graphs 810, 820, and 830 are applied, dichroic and trichromatic monolithic light emitting diodes in which two or more emission spectra are simultaneously generated may be implemented. This will be described in more detail with reference to FIG. 9.

Figure 9:
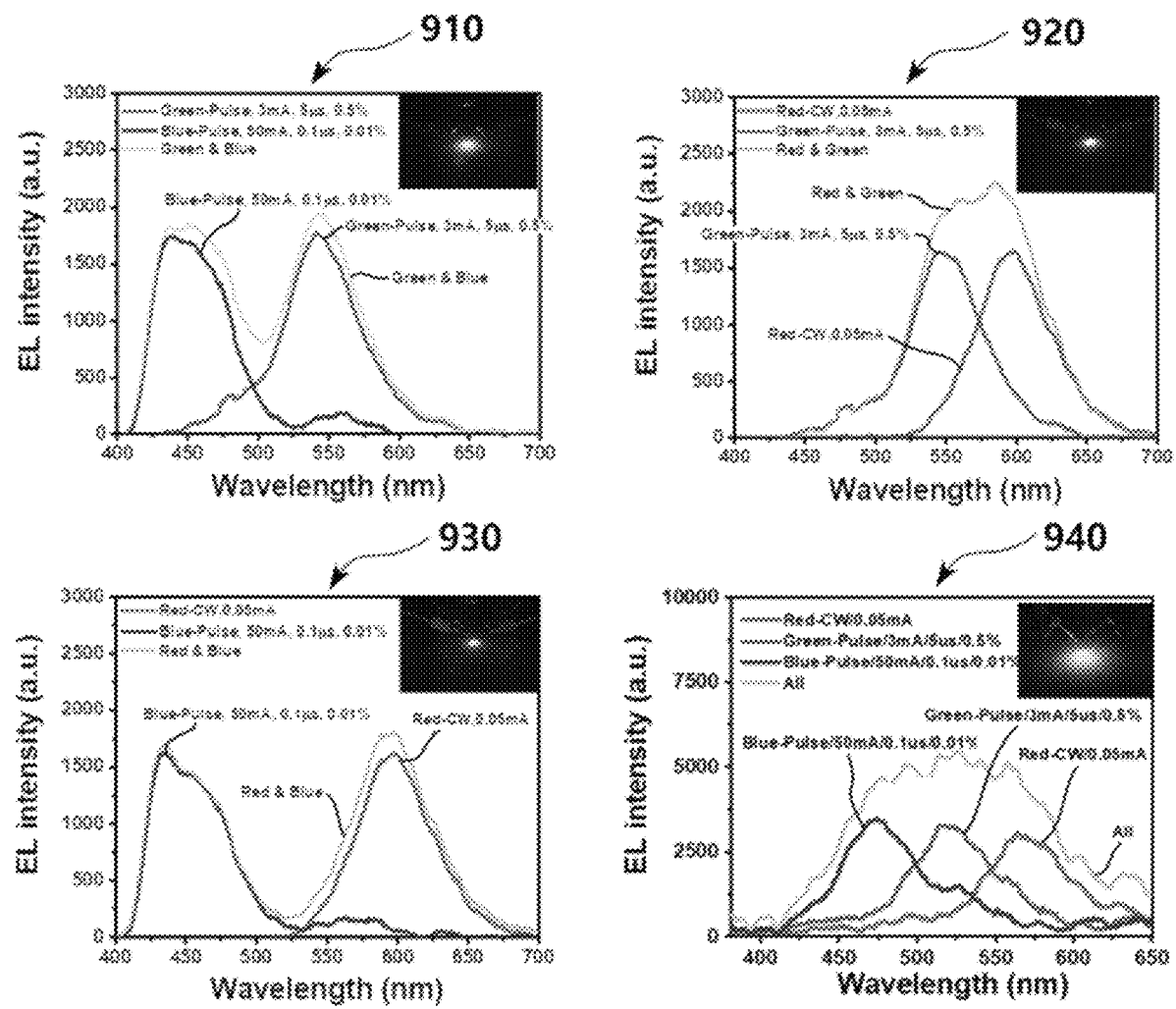
FIG. 9 is a graph illustrating light emission spectra of dichroic and trichromatic monolithic light emitting diodes under two or more different injection current conditions.

FIG. 9 is a graph illustrating light emission spectra of dichroic and trichromatic monolithic light emitting diodes under two or more different injection current conditions.

A graph 910 of FIG. 9 shows that green light can be obtained at about 550 nm when an injection current having a current intensity of 3 mA, a pulse width of 5 μs and a duty cycle of 0.5% is applied to the same light emitting diode, and when an injection current having a current intensity of 50 mA, a pulse width of 0.1 μs and a duty cycle of 0.01% is applied, about 450 nm of blue light can be obtained.

The same light emission intensity was obtained by adjusting the intensity of injection currents and pulse conditions of the two spectra, and when two pulse conditions were used at the same time, a dichroic light-emitting diode emitting blue and green light at the same time was obtained.

In addition, in a graph 920 of FIG. 9, an injection current having a current intensity of 0.05 mA is continuously injected to obtain red light, and when an injection current having a current strength of 3 mA, a pulse width of 5 μs, and a duty cycle of 0.5% is applied, green light could be obtained.

As such, it was possible to obtain an orange color in which both colors were generated when continuous injection and adjustment of pulse conditions were used simultaneously.

In a graph 930 of FIG. 9, an injection current having a current intensity of 0.05 mA is continuously injected to obtain red light, and when an injection current having a current strength of 50 mA, a pulse width of 0.1 μs, and a duty cycle of 0.01% is applied, blue light could be obtained. This also indicated that purple light emission could be obtained when continuous injection and adjustment of pulse conditions were used simultaneously.

Since the red long-wavelength spectrum must exhibit light emission in a low band gap, the intensity of an injection current is low so that the number of injected carriers is small. Therefore, in order to obtain red light emission through continuous injection and to match the light emission intensity of blue-green spectrum and the light emission intensity of red spectrum, green and blue were obtained using a lower pulse width and duty cycle from green to blue.

As shown in a graph 940 of FIG. 9, three light emission spectra can be obtained when three pulse injection conditions are used. When an injection current is applied to a light emitting diode under three conditions of a current intensity of 0.05 mA as a continuous injection condition, and a current intensity of 3 mA, a pulse width of 5 μs, and a duty cycle of 0.5%, and a current intensity of 50 mA, a pulse width of 0.1 μs, and a duty cycle of 0.01% as pulse conditions, red, green, and blue light can each be obtained, and it indicates that white light can be obtained as shown in the graph 940 representing the spectrum.

As such, each blue-green-red light emitting diode is expected to be used as a light source for a full-color LED display.

According to one exemplary embodiment of the present disclosure, it is possible to provide a nitride-based light emitting diode that emits light in various colors through a change in a wavelength according to a change in a pulse condition of an injection current.

According to one exemplary embodiment of the present disclosure, it is expected that a full color display can be realized in one light emitting diode by controlling a pulse condition and an intensity of an injection current.

According to one exemplary embodiment of the present disclosure, by using two or more pulse conditions, it is expected that not only various mixed colors can be made, but also a white light source is possible through blue-green-red light emission.

What is claimed is:

1. A light emitting diode system, comprising:
a nitride-based multi-wavelength light emitting diode including a first semiconductor layer doped with an n-type material, a second semiconductor layer doped with a p-type material, and an active layer disposed between the first semiconductor layer and the second semiconductor layer and having a structure of an indium gallium nitride (InGaN)-based quantum well, wherein the active layer has different In composition for each position according to a crystal growth plane; and
a control unit configured to adjust and apply at least one of a pulse width and a duty cycle of an injection current, while maintaining the same intensity of the injection current to the nitride-based multi-wavelength light emitting diode so that wavelength variation occurs by filling energy band gaps of different sizes formed according to the different In composition in the active layer and the nitride-based multi-wavelength light emitting diode,
wherein the control unit configured to apply two or more injection currents having different pulse widths and duty cycles so that the nitride-based multi-wavelength light emitting diode emits light of two or more wavelengths to realize a full-color display.

2. The light emitting diode system of claim 1, wherein a wavelength of light emitted by the nitride-based multi-wavelength light emitting diode decreases as the pulse width of the injection current increases.

3. The light emitting diode system of claim 1, wherein a wavelength of light emitted by the nitride-based multi-wavelength light emitting diode decreases as the duty cycle of the injection current increases.

4. A control method of a light emitting diode system comprising a nitride-based multi-wavelength light emitting diode including a first semiconductor layer doped with an n-type material, a second semiconductor layer doped with a p-type material, and an active layer disposed between the first semiconductor layer and the second semiconductor layer and having a structure of an indium gallium nitride (InGaN)-based quantum well, wherein the active layer has different In composition for each position according to a crystal growth plane, comprising:
adjusting and applying at least one of a pulse width and a duty cycle of an injection current, while maintaining the same intensity of the injection current to the nitride-based multi-wavelength light emitting diode so that wavelength variation occurs by filling energy band gaps of different sizes formed according to the different In composition in the active layer,
wherein the applying includes applying two or more injection currents having different pulse widths and duty cycles so that the nitride-based multi-wavelength light emitting diode emits light of two or more wavelengths to realize a full-color display.

5. The control method of claim 4, wherein a wavelength of light emitted by the nitride-based multi-wavelength light emitting diode decreases as the pulse width of the injection current increases.

6. The control method of claim 4, wherein a wavelength of light emitted by the nitride-based multi-wavelength light emitting diode decreases as the duty cycle of the injection current increases.

* * * * *